(12) United States Patent
Larson

(10) Patent No.: US 6,827,130 B2
(45) Date of Patent: Dec. 7, 2004

(54) HEATSINK ASSEMBLY AND METHOD OF MANUFACTURING THE SAME

(75) Inventor: Ralph I. Larson, Bolton, MA (US)

(73) Assignee: Heat Technology, Inc., Sterling, MA (US)

( * ) Notice: Subject to any disclaimer, the term of this patent is extended or adjusted under 35 U.S.C. 154(b) by 61 days.

(21) Appl. No.: 10/162,377

(22) Filed: Jun. 4, 2002

(65) Prior Publication Data

US 2002/0179290 A1 Dec. 5, 2002

Related U.S. Application Data

(60) Provisional application No. 60/369,726, filed on Apr. 4, 2002, provisional application No. 60/295,932, filed on Jun. 5, 2001, and provisional application No. 60/305,007, filed on Jul. 12, 2001.

(51) Int. Cl.$^7$ .................................................. F28F 7/00
(52) U.S. Cl. ...................... 165/80.3; 165/185; 361/697; 361/703; 361/710; 174/16.3; 257/706; 257/722
(58) Field of Search ................................ 165/80.3, 185; 361/697, 704, 710, 703; 257/706, 722; 174/16.3

(56) References Cited

U.S. PATENT DOCUMENTS

| | | | | |
|---|---|---|---|---|
| 2,510,024 A | * | 5/1950 | Mayer | 165/170 |
| 3,748,889 A | * | 7/1973 | Miller et al. | 72/382 |
| 4,620,216 A | * | 10/1986 | Horvath | 357/81 |
| 5,494,098 A | | 2/1996 | Morosas | |
| 5,523,918 A | | 6/1996 | Chiou | |
| 5,529,120 A | * | 6/1996 | Howard et al. | 165/166 |
| 5,706,169 A | | 1/1998 | Yeh | |
| 5,957,194 A | * | 9/1999 | Azar | 165/80.3 |
| 6,176,304 B1 | | 1/2001 | Lee | |
| 6,230,789 B1 | * | 5/2001 | Pei et al. | 165/80.3 |
| 6,263,955 B1 | * | 7/2001 | Azar | 165/80.3 |
| 6,330,908 B1 | * | 12/2001 | Lee et al. | 165/185 |
| 6,360,816 B1 | * | 3/2002 | Wagner | 165/122 |
| 6,450,250 B2 | * | 9/2002 | Guerrero | 165/104.33 |
| 6,535,385 B2 | * | 3/2003 | Lee | 361/697 |
| 2002/0121365 A1 | | 9/2002 | Kozyra | |

FOREIGN PATENT DOCUMENTS

| | | |
|---|---|---|
| EP | 0809287 A1 | 11/1997 |
| EP | 0942468 A2 | 9/1999 |
| EP | 1081760 A2 | 3/2001 |
| EP | 0942468 A3 | 5/2002 |
| WO | WO 98/44554 | 10/1998 |
| WO | WO 02/097881 A2 | 12/2002 |

OTHER PUBLICATIONS

Copy of International Search Report for PCT/US02/17687 dated Aug. 29, 2003.

* cited by examiner

Primary Examiner—Terrell McKinnon
(74) Attorney, Agent, or Firm—Daly, Crowley & Mofford, LLP

(57) ABSTRACT

A heat removal system includes a heatsink assembly having a base and a plurality of heat conducting folded fin members projecting from a first surface of the base and arranged to leave an open space on the first surface of the base. At least one thermally conductive slug projects from the center of the folded fin members and the folded fin members are thermally coupled to the slug. A gas circulating system is disposed over the slug and fin members projecting from the first surface of the base. The sidewall of a fin may be provided with at least one aperture. The top surface of the fin is closed, thereby permitting the fin to operate as a plenum of sorts. The bottom of the troughs may also be closed. The fins/troughs act as a plenum. A method of producing the folded fin heatsink member is also described.

20 Claims, 13 Drawing Sheets

HEATSINK ASSEMBLY AND METHOD OF MANUFACTURING THE SAME

CROSS REFERENCE TO RELATED APPLICATIONS

This application claims priority under 35 U.S.C. § 119(e) to provisional patent application Ser. No. 60/295,932 filed Jun. 5, 2001, to provisional patent application Ser. No. 60/305,007 filed Jul. 12, 2001, and to provisional patent application Ser. No. 60/369,726 filed Apr. 4, 2002; the disclosures of which are incorporated by reference herein.

BACKGROUND OF THE INVENTION

As is known in the art, there is a trend to reduce the size of semiconductor devices, integrated circuits and microcircuit modules while at the same time having the devices, circuits and modules perform more functions. To achieve this size reduction and increased functionality, it is necessary to include a greater number of active circuits, such as transistors for example, in a given unit area. As a consequence of this increased functionality and dense packaging of active devices, such devices, circuits and modules (hereinafter collectively referred to as "circuits") use increasingly more power. Such power is typically dissipated as heat generated by the circuits.

This increased heat generation coupled with the need for circuits to have increasingly smaller sizes has led to an increase in the amount of heat generated in a given unit area. To further exacerbate the problem, the circuits are often densely mounted on printed circuit boards.

This increase in the amount of heat generated in a given unit area has led to a demand to increase the rate at which heat is transferred away from the circuits in order to prevent the circuits from becoming damaged or destroyed due to exposure to excessive heat. To increase the amount of heat that such circuits can withstand, the circuits can include internal heat pathways which channel or otherwise direct heat away from the most heat-sensitive regions of the circuits.

Although this internal heat pathway technique increases the amount of heat which the circuits can withstand while still operating, one problem with this internal heat pathway technique is that the amount of heat generated by the circuits themselves often can exceed the amount of self-generated heat which the circuits can successfully expel as they are caused to operate at higher powers. Furthermore, other heat generating circuit components mounted on printed circuit boards proximate the circuits of interest further increase the difficulty with which heat can be removed from heat sensitive circuits. Thus, to increase the rate at which heat is transferred away from the circuits, a heatsink is typically attached to the circuits.

Such heatsinks typically include a base from which project fins or pins. The fins or pins are typically provided by metal extrusion, stamping or other mechanical manufacturing techniques. The heatsinks conduct and radiate heat away from the heat generating and thermally vulnerable regions of circuits. To further promote the heat removal process, fans are typically disposed adjacent the heatsink to blow or otherwise force air or gas through the sides of the fins or pins of the heatsink.

One problem with this approach, however, is that the amount of air or other gas which a fan or blower can force through the heatsink fins/pins is limited due to the significant blockage of gas flow pathways due to the fins/pins themselves. Furthermore, in a densely populated printed circuit board (PCB) or multi-circuit module (MCM), other circuit components and mechanical structures required to provide or mount the PCB or module present additional blockage to gas pathways and also limits the amount of gas flow through the heatsink thus limiting the effectiveness of the heatsink. Thus, the ability of such conventional heatsinks and heatsink fan assemblies is limited and is not sufficient to remove heat as rapidly as necessary to ensure reliable operation of state of the art devices, circuits and modules having increased thermal cooling requirements.

It would, therefore, be desirable to provide a heat removal system which requires a relatively small surface area for mounting and which is capable of removing an amount of heat which is greater than the amount of heat removed by conventional heatsinks requiring a like amount of surface area. It would be further desirable to provide a method and apparatus for producing a heatsink member as part of the heat removal system, and to provide such a member in a cost-effective and repeatable manner.

SUMMARY OF THE INVENTION

In accordance with the present invention, a heat removal system includes a heatsink having a base and a plurality of heat conducting folded fin members projecting from a first surface of the base and arranged to leave an open space on the first surface of the base. At least one thermally conductive slug projects from the center of the fin members. A gas circulating system (e.g. a fan) is disposed over the slug and fin members. With his particular arrangement, a heat removal system (a fan-heat sink assembly) which rapidly removes heat from devices, circuits and modules including high power CPU chips and custom ASICS is provided. By disposing the gas circulating system above the base and the thermally conductive slug and fins, the gas circulating system increases the amount of gas flow through and around the heat conducting members and thermally conductive plate. In a preferred embodiment, the gas circulating system blows gas downward toward a PC board on which a heat generating device is disposed. The folded fin members and slug provide increased heat sinking capability. In one embodiment, the folded fin heat sink members are arranged in a circular shape and are attached to a surface of a central slug having a right circular cylinder shape and disposed in the center of the circle formed by the folded fin members. The gas circulating system may be provided as a fan or squirrel cage type blower. In some embodiments it may be preferable to position the gas circulating system below, rather than above the base plate. In such embodiments, the base plate should have one or more openings therein to allow the passage and flow of gas through and around the thermally conductive members and thermally conductive plate. The assembly will be self aligning and self jigging and the attachment means can be by soldering in a belt furnace.

The heatsink assembly folded fin member may be arranged to provide a plurality of fins and troughs. The sidewall of a fin is provided with at least one aperture. The top surface of the fin is closed, thereby permitting the fin to operate as a plenum of sorts. Different aperture patterns, shapes, and sizes are provided to produce the desired cooling for a particular application. The apertures may be provided on only a single sidewall of the fin, or may be provided on both sidewalls of the fin. The bottom of the troughs may also be closed.

A method of producing the folded fin heatsink member is also disclosed. A piece of material is provided having a plurality of holes disposed therein. The material is aligned between a stripper plate and an upper die. Next a fold is punched into the material with a die block and a fin forming punch. The folded piece is retracted from an upper die and the process repeated until the desired number of fins has been produced. Then the folded fins are separated from the unformed material, thereby providing the folded fin member. The apparatus for forming the folded fin member comprises an upper die having a recess formed therein, the upper die being movable between a first upper die position and a second upper die position. The apparatus further includes a pilot pin movably disposed within said upper die and a stripper plate disposed below said upper die and having an aperture disposed there through. The stripper plate is capable of supporting the piece of material being formed into the folded fin heatsink member. A die block is disposed beneath the stripper plate, with the die block movable between a first die block position and a second die block position. The apparatus further includes a forming punch extending from said die block and movable through the aperture in the stripper plate and into the recess of the upper die.

BRIEF DESCRIPTION OF THE DRAWINGS

The invention will be better understood by reference to the following more detailed description and accompanying drawings in which.

DETAILED DESCRIPTION

Figure 1:
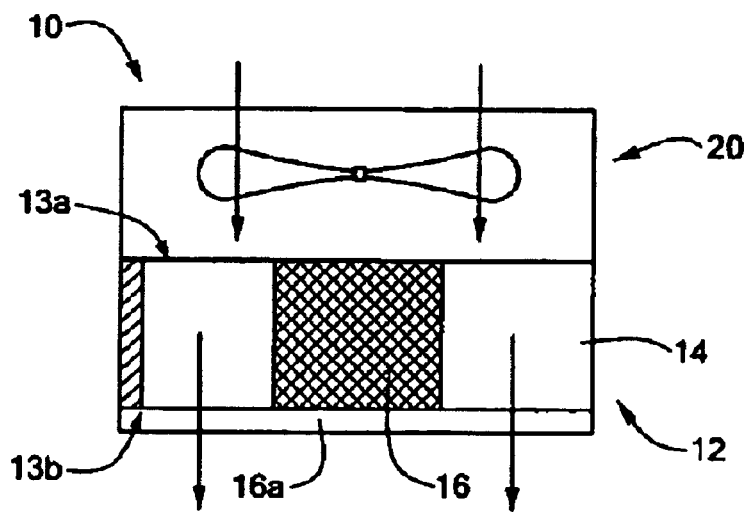
FIG. 1 is a side view of a heat removal system.

Referring now to FIGS. 1–4 in which like elements are provided having like reference designations throughout the several views, a heat removal system 10 includes a heatsink assembly 12 and a gas flow system 20. Gas flow system 20 may be provided as a fan, a squirrel cage blower, or any other device well known to those of ordinary skill in the art to be useful for generating or otherwise increasing gas flow.

In this particular embodiment, the heatsink assembly 12 includes first and second opposing plates 13a and 13b which are each adapted for mounting to the gas flow system 20. Thermally conductive plates 13 are preferably fabricated from a thermally conductive material such as copper or any other thermally conductive material having suitable thermal and mechanical characteristics including but not limited to aluminum, brass, a zinc-aluminum die cast, a zinc alloy material. In the case where the plates are provided from aluminum, the plates are preferably plated to make them solderable. In some applications, it may be desirable or necessary to provide each of the plates 13 as single unitary pieces or as more than one piece. The plates form an outer housing similar to the venturi section of an axial fan housing.

The particular number of pieces from which plates 13 are provided may be selected in accordance with a variety of factors including but not limited to the particular application, the amount of heat which must be transferred away from heat generating devices, the amount of space available for mounting of the heat sink and other components, the material from which plate 13 is provided, the particular manufacturing techniques used and the cost to manufacture the plate. Similarly, the particular number of plates is also selected in accordance with consideration of the above-listed factors. In some applications related to cooling of processors (e.g. computer central processing units, digital signal processing units or image processing units) and other integrated circuits, six to ten plates may be used.

Disposed between and in thermal contact with the plates 13a, 13b is a folded fin heat sink member 14. In this particular example, the folder fin member is disposed in a circular shape. Thos of ordinary skill in the art should appreciate that other shapes may also be used. The folded fin members are thermally coupled to a thermally conductive slug 16. A first surface of the slug is adapted to be in contact with an active portion of a heat generating device (e.g. an integrated circuit). Thus the folded fin member 14 is wrapped around the central post or slug 16. Typically, the folded fin member 14 and central post 16 are provided from tinned copper.

Ideally, the portion of the slug 16 in contact with the heat generating device should be provided having a shape which covers as much as possible the active area of the heat generating device. In one embodiment, the central post 16 is machined flat and a thermal interface material is disposed on the surface of the post 16 which will be in contact with the heat generating device. The thermal interface material may be a thermoelectric material or a thermoionic material. Thus, for example, in the case where the heat generating device is an IC which itself includes an internal heat sink, the slug 16 should cover the internal heat sink of the IC.

Also, it may be desirable or necessary to provide folded fin member 14 as a single unitary piece or as more than one piece. The particular number of pieces from which member 14 is provided may be selected in accordance with a variety of factors including but not limited to the particular application, the amount of heat which must be transferred away from heat generating devices, the amount of space available for mounting of the heat sink and other components, the particular material from which base 14 is provided, the particular manufacturing techniques used to fabricate member 14 and the cost of manufacturing the member 14.

Figure 2:
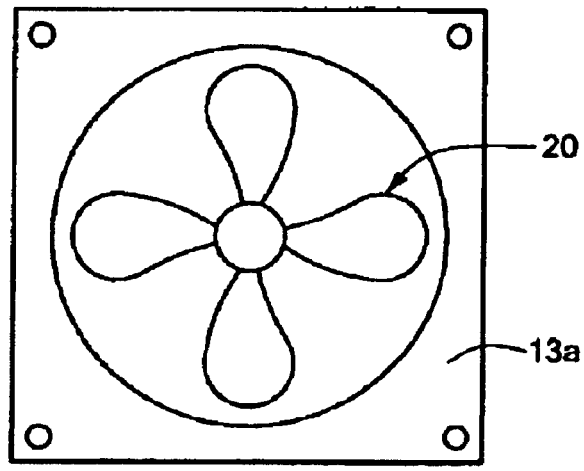
FIG. 2 is a top view of a heat removal system.
Figure 3:
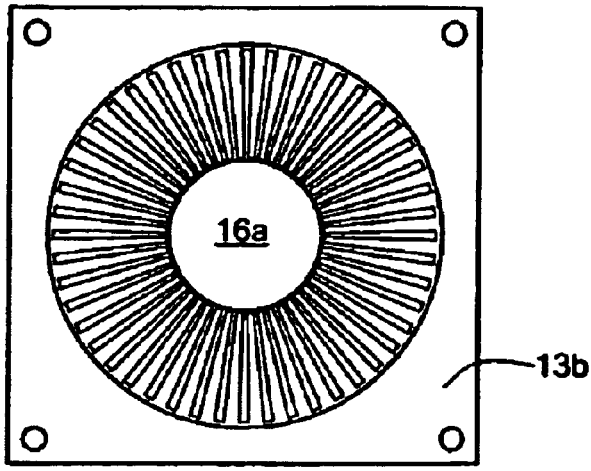
FIG. 3 is a bottom view of a heat removal system.
Figure 4:
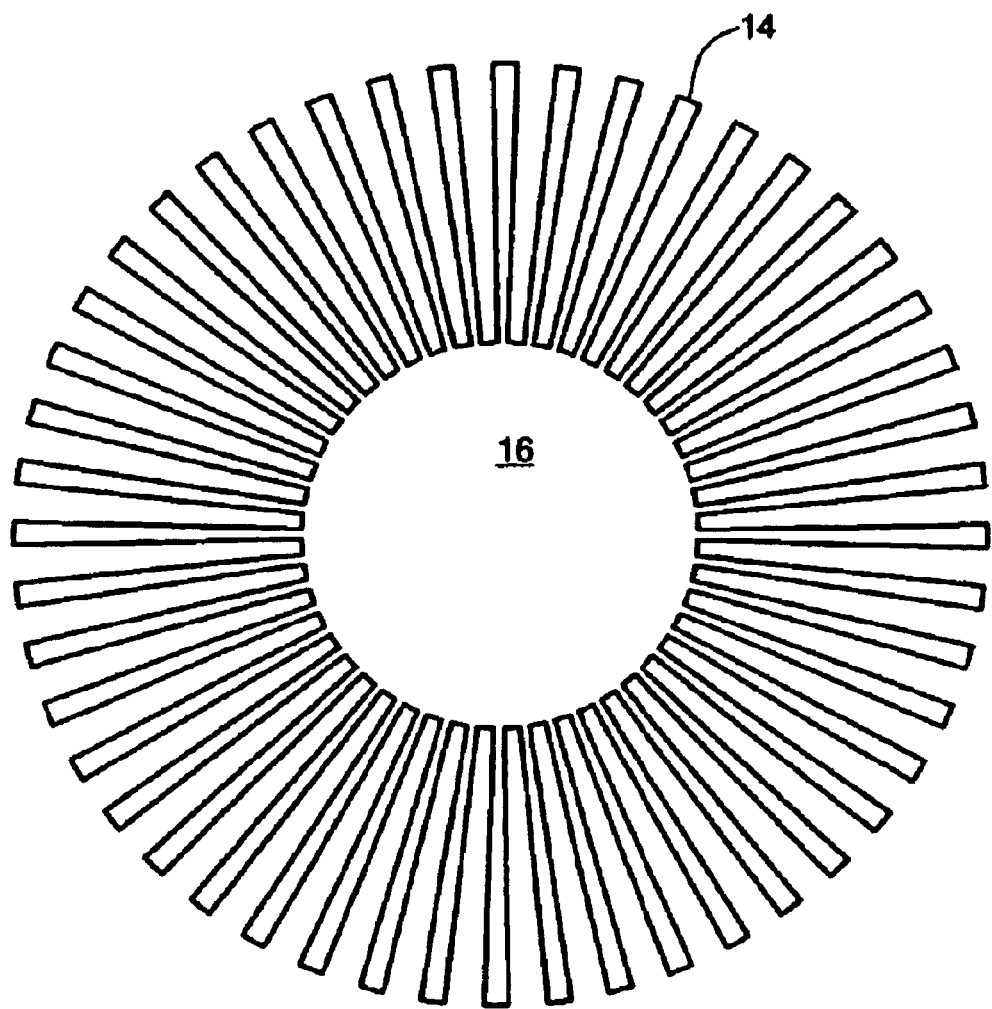
FIG. 4 is an end view of a folded fin members disposed on a base plate.

As shown in FIGS. 1–3, the fan 20 is mounted on the first or top most plate 13a and is spaced-apart from the folded fin member 14 and the heat generating device.

In an exemplary embodiment, the base plate 13b is provided having a substantially square shape, but it should be noted that although plates 13 are here shown having a substantially square shape, other shapes, including, but not limited to, rectangular, circular, oval, square, triangular, rhomboidal and irregular shapes, may also be used. The particular shape of plates 13 will be selected in any particular application in accordance with a variety of factors including but not limited to the shape of the particular part being cooled and the amount of area available for mounting of the heat sink.

Likewise, although slug 16 is provided having a substantially circular shape, other shapes, including, but not limited to, rectangular, circular, oval, square, triangular, rhomboidal and irregular shapes, may also be used. The particular shape of slug 16 will be selected in any particular application in accordance with a variety of factors including but not limited to the shape of the folded fin member 14 and the shape of the particular part being cooled and the amount of area available for mounting of the heat sink.

The heatsink assembly may be coupled to any type of integrated circuit package including, but not limited to, dual-in-line packages (DIP) leadless chip carriers, leaded chip carriers, flat packs, pin-grid arrays as well as other surface mount packages and small outline integrated circuit packages for surface-mounting.

A heatsink as shown and described herein may be disposed over a first surface of an integrated circuit which is disposed on a printed circuit board. Disposed between a first surface of a circuit and a first surface of the heatsink is a sheet of a thermally conductive matrix material. The matrix material facilitates an extraction of heat from the circuit to the heatsink. The material may be either a thermoelectric material or a thermoionic material.

It should also be noted that in some applications it may be desirable to mount the circuit on the printed circuit board prior to placing the heatsink/thermally conductive matrix material assembly on to the circuit. It should also be noted that in some applications it may be desirable to apply the thermally conductive matrix material first to the surface of the circuit and then to mount the heatsink to the circuit/ thermally conductive matrix assembly and then mount the assembly on the PCB.

Referring now to FIGS. 5–8 in which like elements are provided having like reference designations throughout the several views, a heatsink assembly 110 is shown. The heatsink assembly 110 includes a folded fin member 115. In this particular example, the folded fin member 115 is disposed in a circular shape. Those of ordinary skill in the art should appreciate that other shapes may also be used. The folded fin member 115 has a plurality of ridges and troughs which define a plurality of spaced fins 130. A sidewall of a fin includes at least one aperture 160 extending through the sidewall. A side edge of a fin 130 may also include an aperture 170. In a preferred embodiment a plurality of apertures 160 are provided in a predetermined pattern, shape and size to provide the desired cooling. The top edges 140 of the fins 130 are closed, and the bottom edges 150 of the troughs are also closed, thereby allowing the fin/trough combination to act as a plenum.

Figure 6:
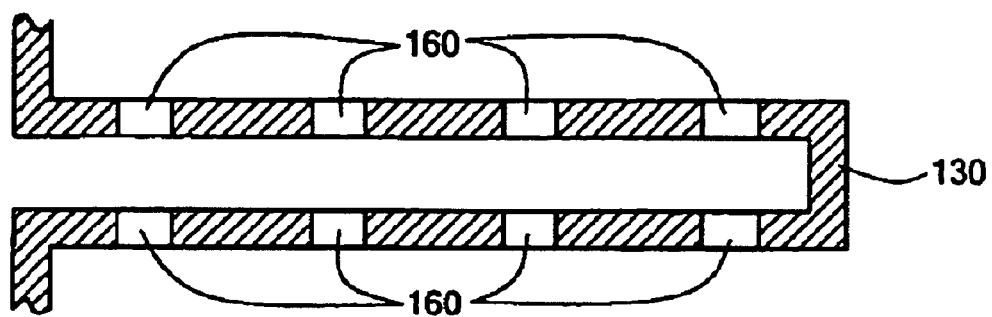
FIG. 6 is a sectional view of a fin showing apertures extending through both sidewalls of the fin.
Figure 7:
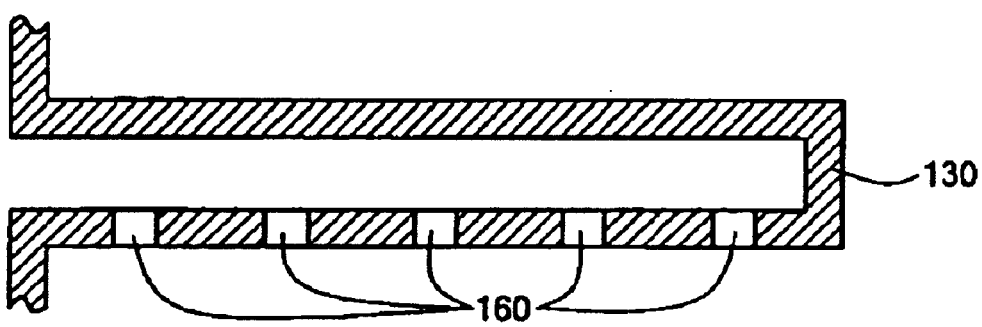
FIG. 7 is a sectional view of a fin showing apertures extending through a single sidewall of the fin.
Figure 8:
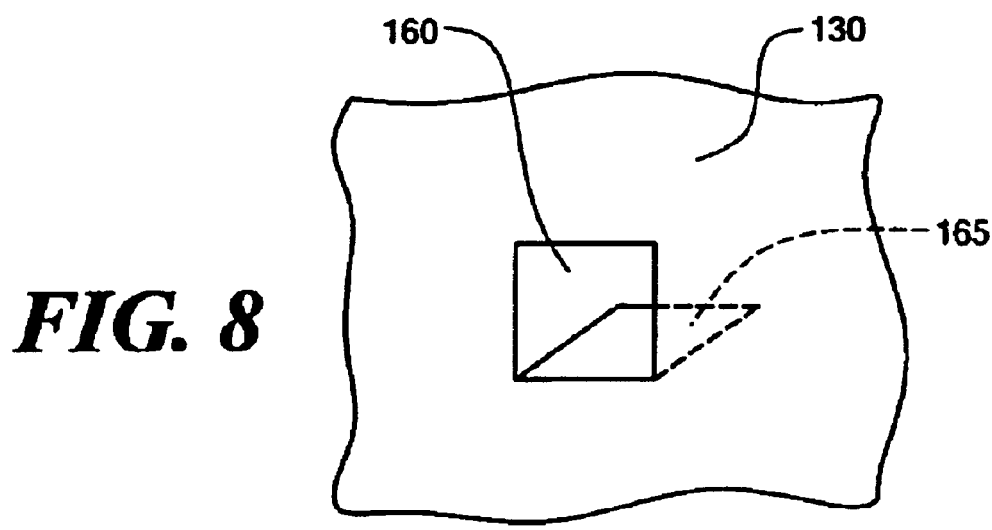
FIG. 8 is sectional view showing an aperture in which the material is displaced away from the sidewall of a fin.

The apertures 160 can be of any size or shape. Referring to FIG. 6, a cross sectional view of a fin 130 shows apertures 160 present in both side walls of the fin. In FIG. 7, a cross-sectional view of a fin shows the apertures 160 disposed in only one sidewall of the fin. Additionally, the material 165 originally in the sidewall 130 where the aperture is provided may not be completely removed, but merely displaced from the sidewall as shown in FIG. 8. This arrangement provides additional material for cooling as opposed to the embodiment wherein the original material in the sidewall is completely removed to form the aperture. Additionally, the portion 165 displaced from the sidewall provides increased turbulence which breaks up boundary layers, thereby providing additional cooling. In addition, an aperture 170 may be disposed in a side edge of a fin.

The heatsink assembly 110 may further include a thermally conductive member or slug (not shown), similar to thermally conductive slug 16 of FIGS. 1–3. A first surface of the member is adapted to be in contact with an active portion of a heat-generating device 180 (e.g. an integrated circuit). Thus the folded fin stock 115 is wrapped around the slug and is in thermal communication with the slug. Typically, the folded fin stock and slug are provided from tinned copper or aluminum. The slug may be of any shape, and the folded fin material may follow the shape of the slug and have edges of the fins attached to the slug. While the slug is shown in a generally vertical alignment with respect to the device being cooled, the slug may be tilted such that the cylindrical slug is at an angle with respect to the device being cooled. The bottom surface of the slug is provided having an angled surface such that the bottom surface of the slug would be in contact with the device being cooled. Similarly, the folded fin member would also be attached to the slug such that the folded fins would be at an angle with respect to the device being cooled. Alternately, the slug is generally perpendicular to the device being cooled, and the fins are provided having different heights such that one section of the fins are lower than another section, thereby defining an air scoop section for receiving cooling gas provided in a generally non-vertical direction.

Ideally, the portion of the slug in contact with the heat generating device 180 is provided having a shape which covers as much as possible the active area of the heat generating device. In one embodiment, the slug is machined flat and a thermal interface material is disposed on the surface of the member which will be in contact with the heat generating device. Thus, for example, in the case where the heat-generating device is an IC which itself includes an internal heatsink, the member should cover the internal heatsink of the IC.

In an exemplary embodiment, the thermally conductive slug is provided having a substantially circular shape, other shapes, including, but not limited to, rectangular, circular, oval, square, triangular, rhomboidal and irregular shapes, may also be used. The particular shape of the member will be selected in any particular application in accordance with a variety of factors including but not limited to the shape of the folded fin member and the shape of the particular part being cooled and the amount of area available for mounting of the heatsink.

Figure 9A:
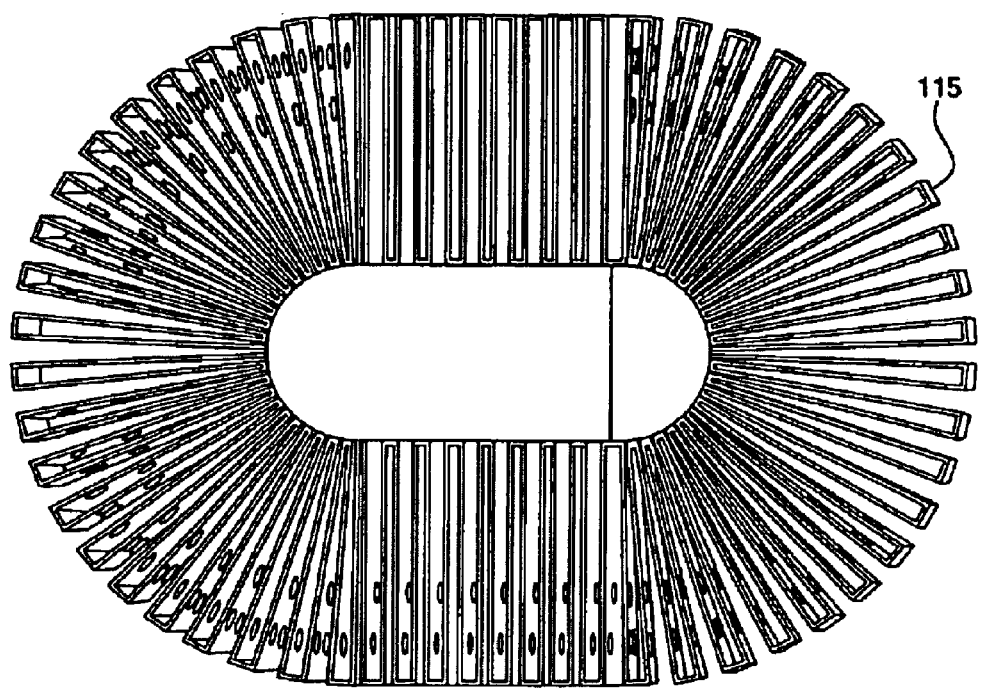
FIG. 9A is a top view of an oval folded fin member attached to a circular base.
Figure 9B:
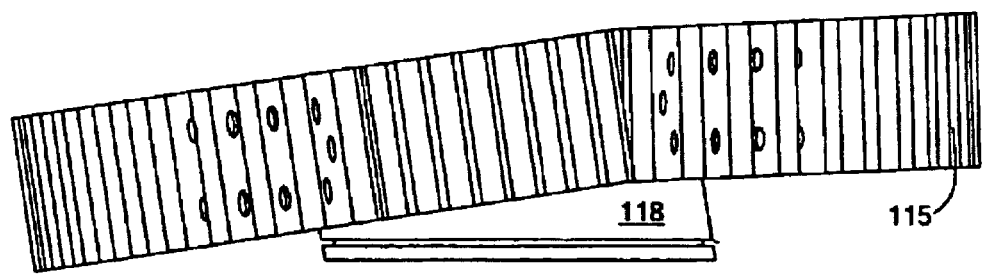
FIG. 9B is a side view of the folded fin member of FIG. 9A.
Figure 9C:
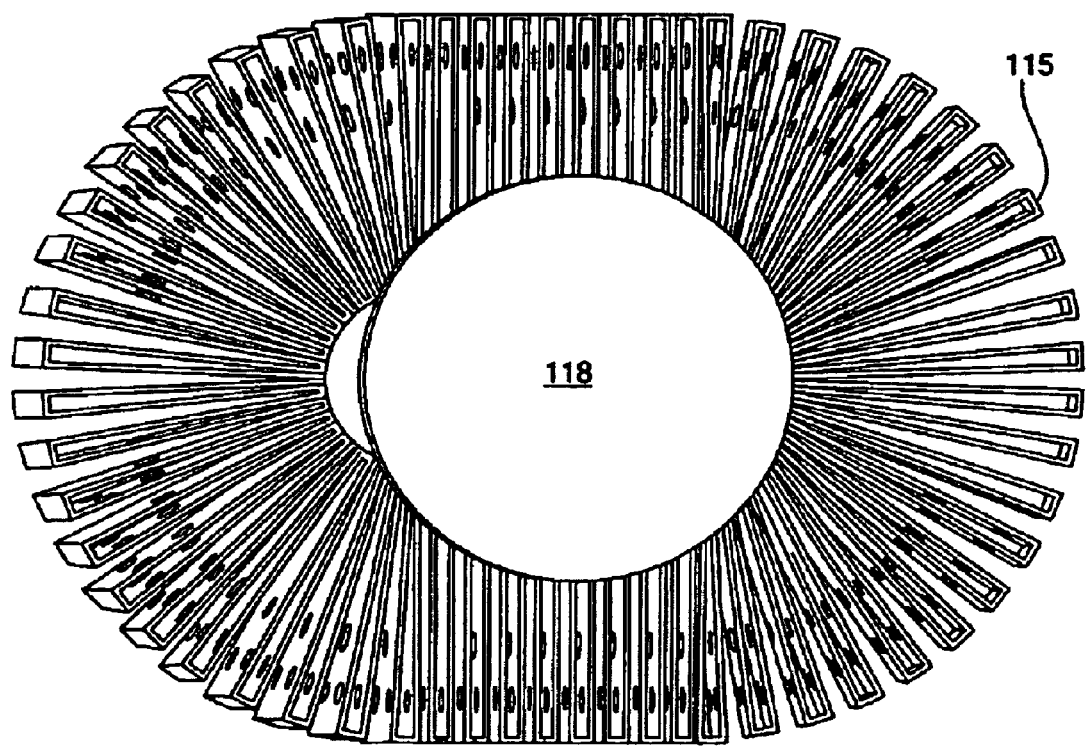
FIG. 9C is a bottom view of the folded fin member of FIG. 9A.
Figure 10A:
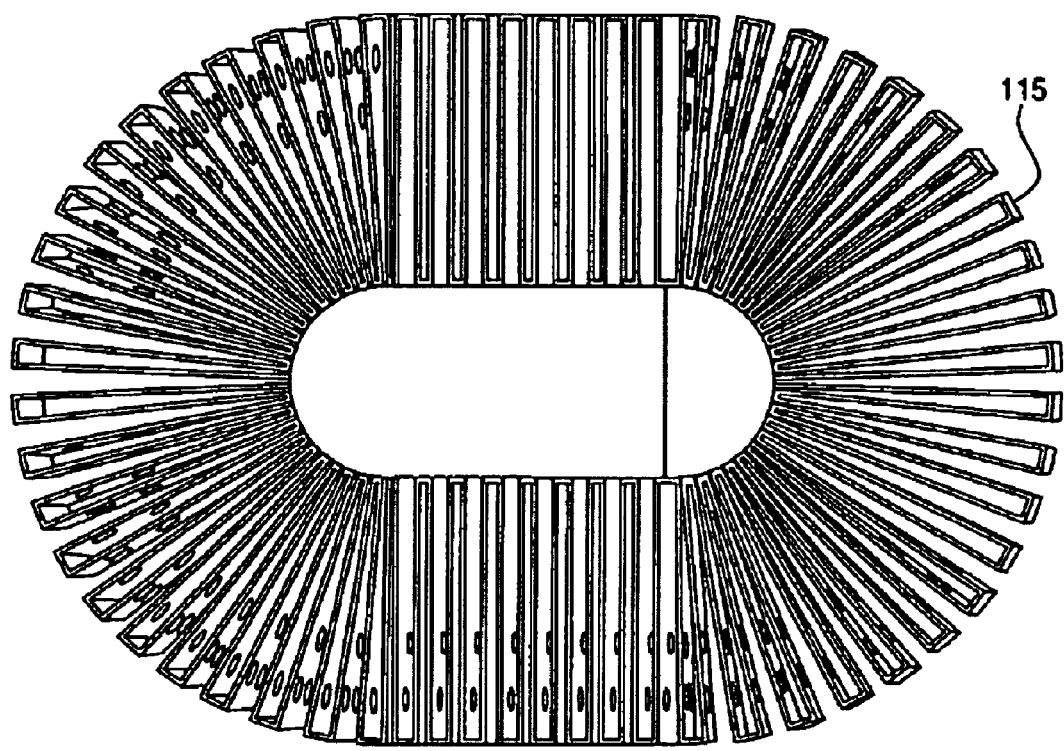
FIG. 10A is a top view of a folded fin member attached to a square base.
Figure 10B:
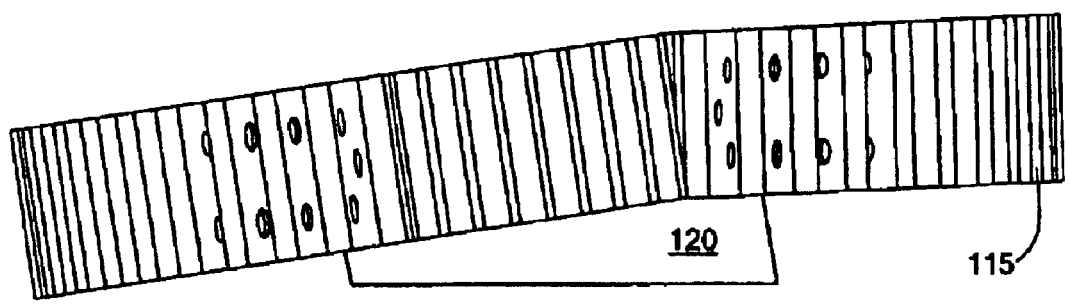
FIG. 10B is a side view of the folded fin member of FIG. 10A.
Figure 10C:
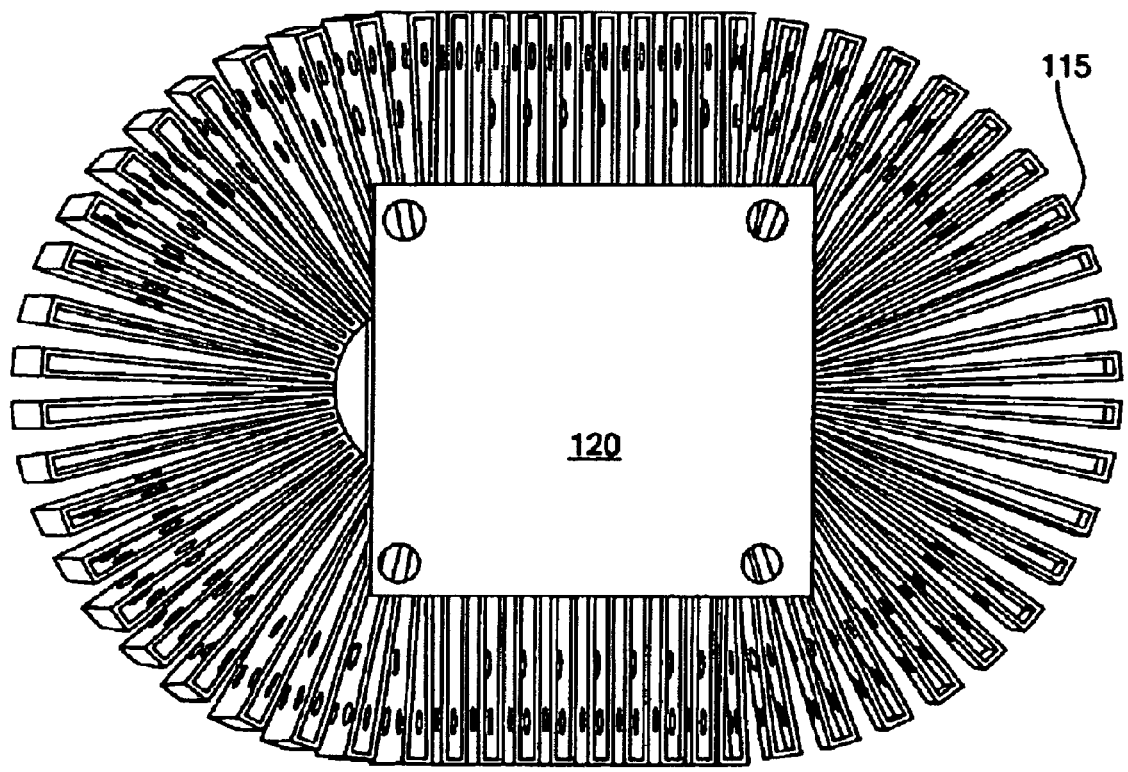
FIG. 10C is a bottom view of the folded fin member of FIG. 10A.

Referring now to FIGS. 9A–9C, a folded fin member 115 is shown having a generally oval shape. The folded fin member is shown coupled to a generally circular base 118 in FIGS. 9A–9C, and is shown couple dot a generally square base in FIGS. 10A–10C. as shown in FIGS. 9B and 10C the folded fin member can be disposed such that a first portion of the folded fin member is at a different v\horizontal height than another portion of the fodled fin member. This orientation provides additional cooling as a gas source may be couples to provide gas in a generally horizontal direction to impinge on the fins.

It may be desirable or necessary to provide folded fin member 115 as a single unitary piece or as more than one piece. The particular number of pieces from which the folded fin member 115 is provided may be selected in accordance with a variety of factors including but not limited to the particular application, the amount of heat which must be transferred away from heat generating devices, and the amount of space available for mounting of the heatsink and other components.

Figure 5:
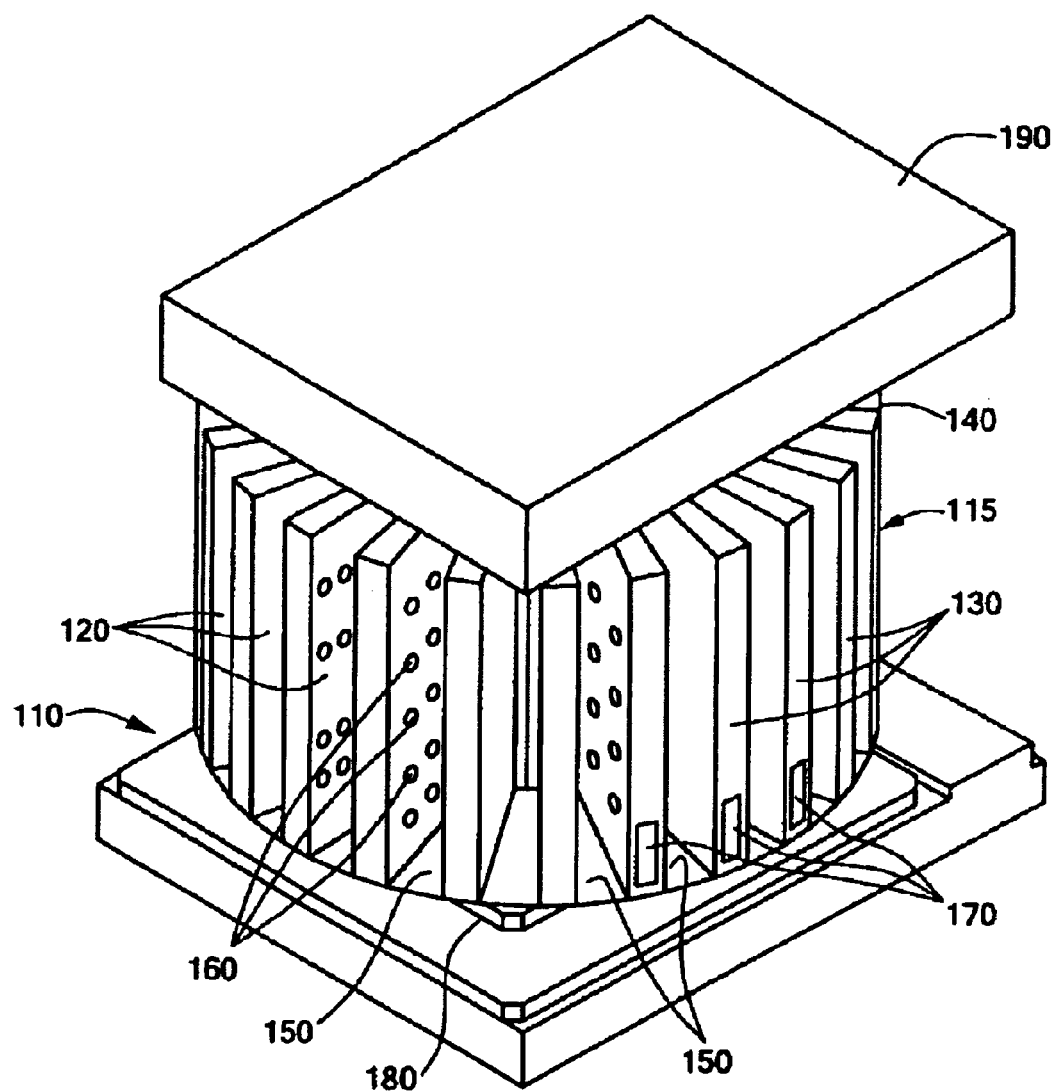
FIG. 5 is an isometric view of the heatsink assembly of the present invention.

As shown in FIG. 5 a gas supply source 190 is coupled to the folded fin member 115 and the heat-generating device 180. The gas supply source 190 may be a fan, a blower or a compressed gas source and supplies gas to the folded fin member 115 and to the slug.

The heatsink assembly 110 may be coupled to any type of integrated circuit package including, but not limited to, dual-in-line packages (DIP) leadless chip carriers, leaded chip carriers, flat packs, pin-grid arrays as well as other surface mount packages and small outline integrated circuit packages for surface-mounting.

The heatsink assembly 110 as shown and described herein may be disposed over a first surface of an integrated circuit which is disposed on a printed circuit board. Disposed between a first surface of a circuit and a first surface of a heatsink is a sheet of a thermally conductive matrix material. The matrix material facilitates an extraction of heat from the circuit to the heatsink.

It should also be noted that in some applications it may be desirable to mount the circuit on the printed circuit board prior to placing the heatsink/thermally conductive matrix material assembly on to the circuit. It should also be noted that in some applications it may be desirable to apply the thermally conductive matrix material first to the surface of the circuit and then to mount the heatsink to the circuit/thermally conductive matrix assembly and then mount the assembly on the PCB.

The above-described heatsink assembly rapidly and efficiently removes heat from devices, circuits and modules. The heatsink assembly of the present invention is relatively inexpensive to manufacture, assemble and install.

The present invention further comprises an apparatus and a method for providing the folded fin heat sink member 115. The method utilizes an apparatus to perform a variety of functions which results in the formation of a folded fin heat sink member 115 having certain desirable characteristics.

The apparatus for performing the method includes two stamping machines coupled together with an air feeder mechanism. The first stamping machine is conventional in design, and is used to place a plurality of holes or apertures in predetermined areas of the material. The second stamping machine is used to provide the folding of the material into the desired shape.

Figure 11:
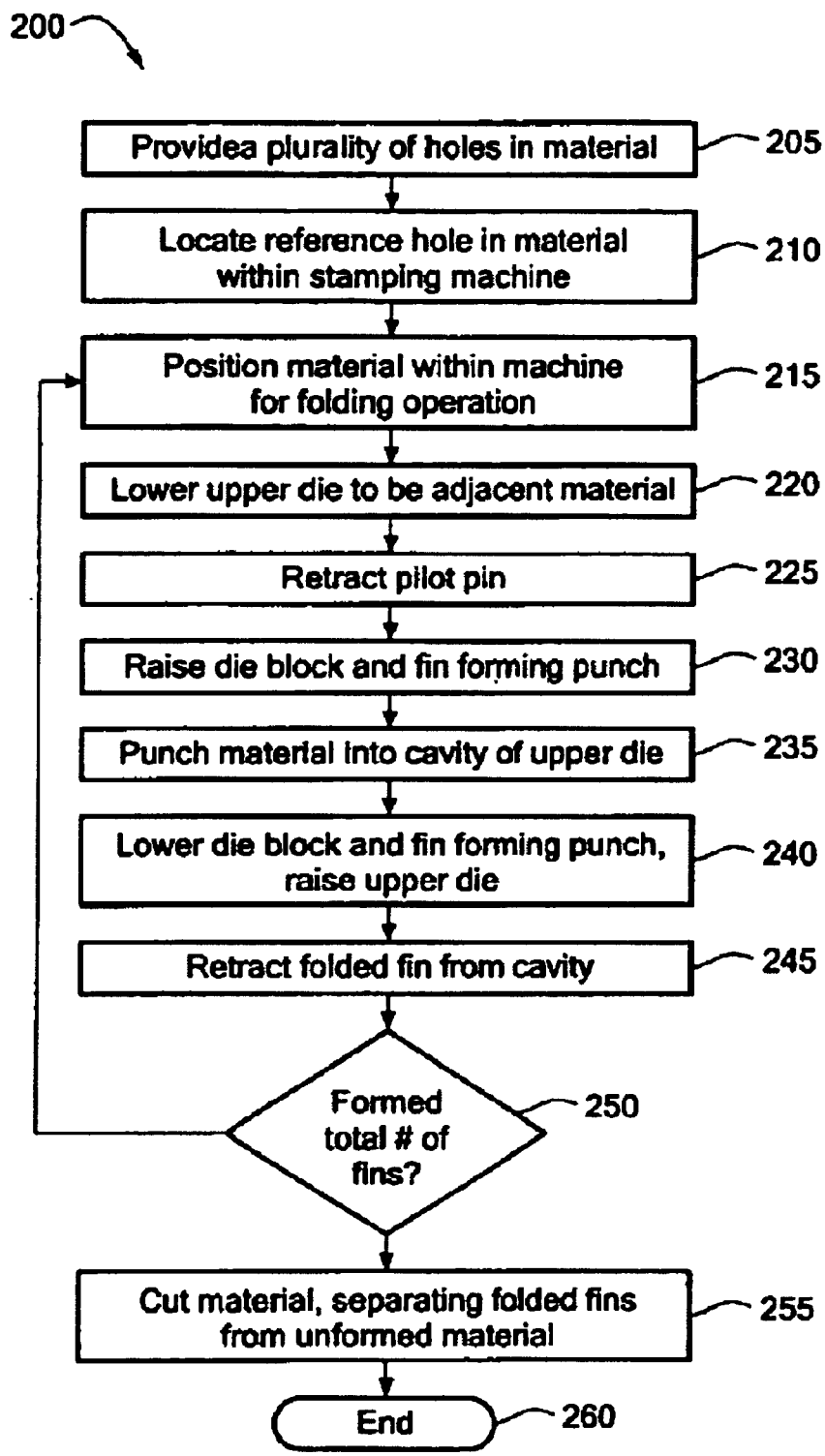
FIG. 11 is a flow chart of the present method for providing a folded fin heatsink member.

Referring now to FIG. 11, a flow chart of the method 200 is shown. The rectangular elements, are herein denoted "processing blocks" and represent computer software instructions or groups of instructions. The diamond shaped elements, are herein denoted "decision blocks," represent computer software instructions, or groups of instructions which affect the execution of the computer software instructions represented by the processing blocks.

Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required in accordance with the present invention. It should be noted that many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention. Thus, unless otherwise stated the steps described below are unordered meaning that, when possible, the steps can be performed in any convenient or desirable order.

The first step is step 205 and recites that a plurality of holes are provided in the material. One of the holes may function as an index hole and provide a reference point for the second stamping machine. The holes may be of any design or shape and any number of holes may be provided in the material. The holes may be punched clear through such that the material which formerly occupied the hole is completely removed from the rest of the material, or the holes may be provided such that the material which formerly occupied the hole is displaced such that it is only partially removed, and remains attached to the remaining material while still providing an aperture through the material.

Figure 12:
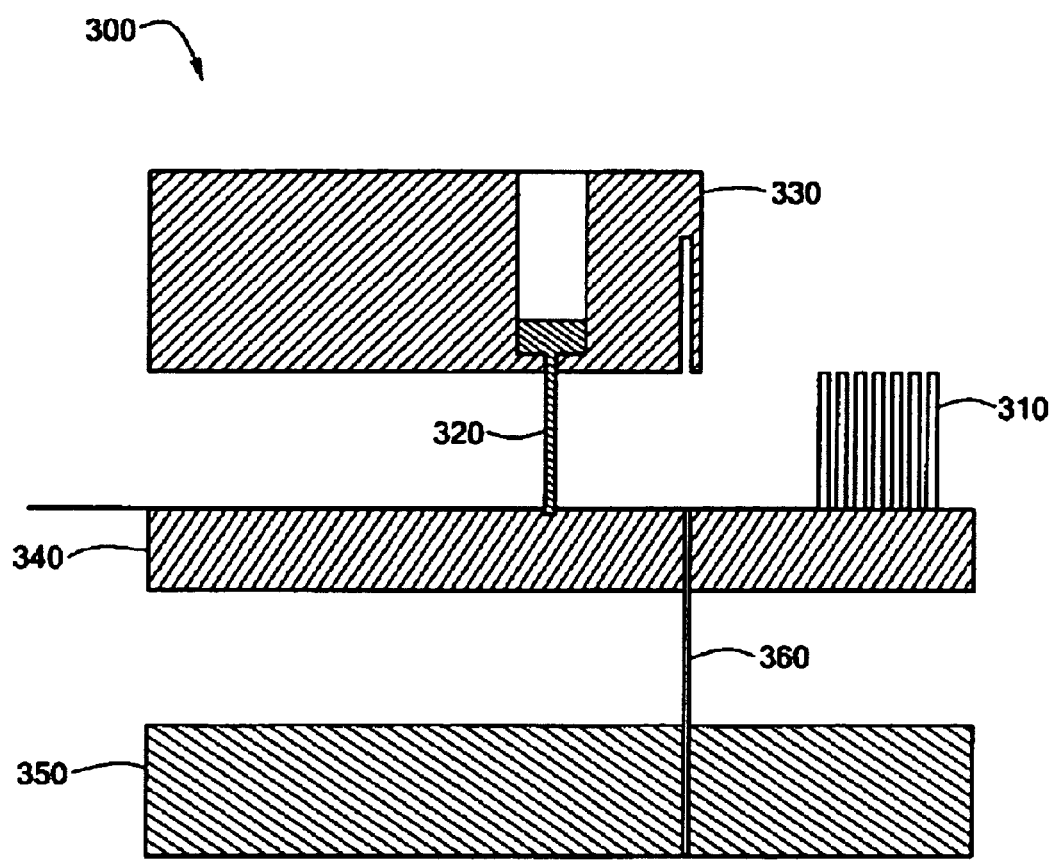
FIG. 12 is a block diagram of the apparatus used for performing a first part of the method.

Referring now also to FIG. 12, step 210 of the method is shown. In this stamping machine 300, and as recited in step 210, a reference hole is located within the material. The upper die 330 of the stamping machine includes a pilot pin 320. The pilot pin 320 guides the material to its desired position for the folding as recited in step 215.

Figure 13:
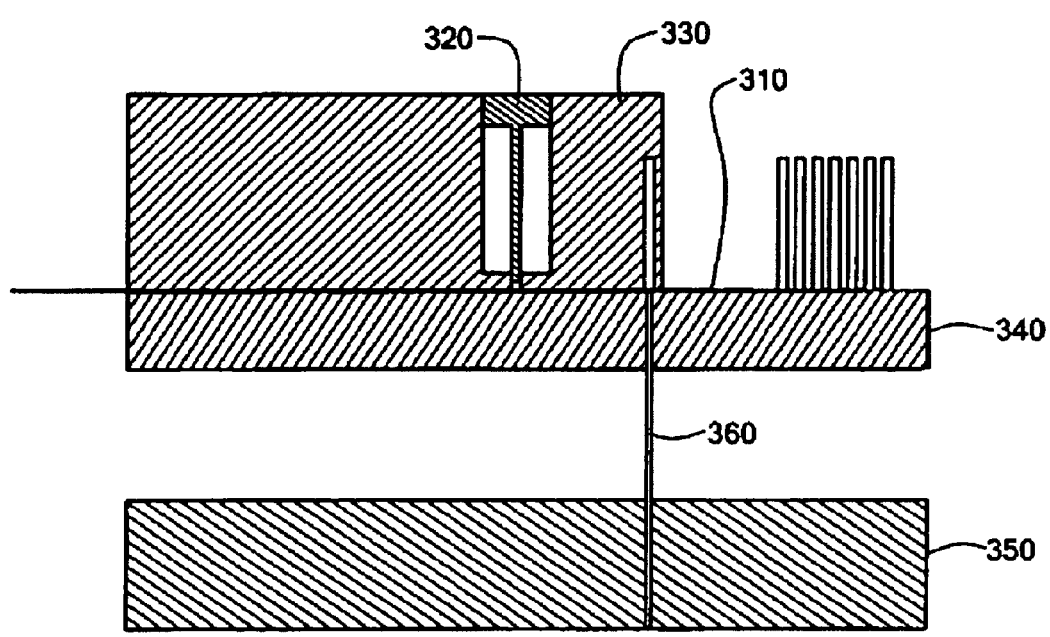
FIG. 13 is a block diagram of the apparatus used for performing a second part of the method.

During step 220, and as shown in FIG. 13, the upper die 330 is lowered until it is adjacent the material. The material is now secured in position between the stripper plate 340 and the upper die 330. During this time the pilot pin 320 retracts into the upper die 330 as recited in step 225.

Figure 14:
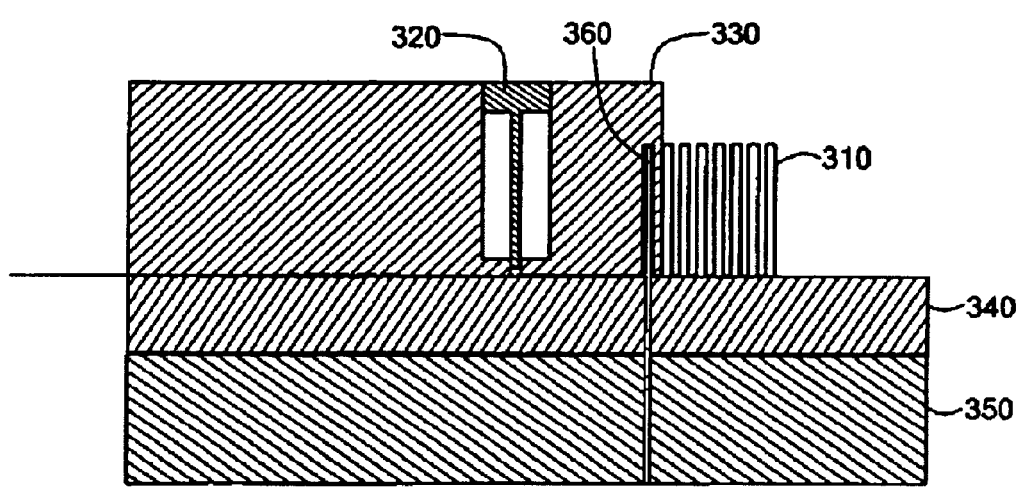
FIG. 14 is a block diagram of the apparatus used for performing a third part of the method.

Referring now to FIG. 14, the apparatus is shown during step 230. The die block 350 and fin forming punch 360 are raised up to the stripper plate 340. During step 235, the fin forming punch 360 draws the material into the cavity of the upper die 330. At the end of this step the fold is complete in the upper die 330.

Figure 15:
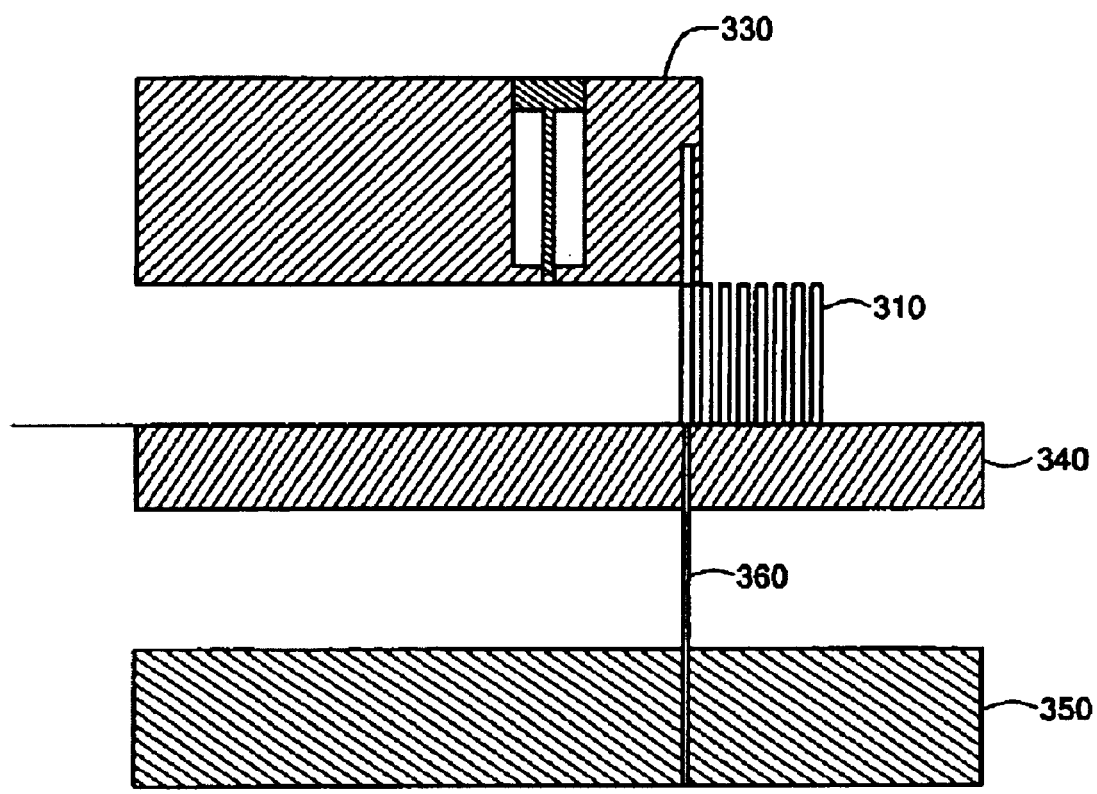
FIG. 15 is a block diagram of the apparatus used for performing a fourth part of the method.

Step 240 is depicted in FIG. 15. At this step the die block 350 and the forming punch 360 are lowered back to their starting position. The upper die 330 is also raised away from stripper plate 340. Upper die 330 further includes a knock back device (not shown) that aids in removing the just-formed folded fin from the cavity as the upper die is raised as recited in step 245.

At step 250, a determination is made whether the desired number of fins has been formed. If not, then steps 215 et seq. are performed again. When the desired number of fins have been formed operation proceeds to step 255 wherein the material is cut thereby providing the folded fin member. In a particular application, the fin folding process is performed a total of 63 times to form the folded fin member. There is a counting device which counts up to 63 and then a cutting tool cuts off the string of folded fins. Following step 255, the process is finished, as shown at step 260.

By way of the presently disclosed method and apparatus it is very simple to change fin heights and pitch by simply changing the front edge of the upper die and the forming punch. A variety of materials can be used to form the folded fin member, in the preferred embodiment copper is the material of choice. The number of fins, the height of the fins, and the spacing of the fins can be of any size, dependent on the application the folded fin member will be utilized in.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims.

All publications and references cited herein are expressly incorporated herein by reference in their entirety.

What is claimed is:

1. A heatsink assembly comprising:

a folded fin member;

a first plate having said folded fin member disposed on a first surface thereof, said first plate covering a bottom surface of said folded fin member;

a second plate disposed over and in thermal contact with said folded fin member, said second plate covering a top surface of said folded fin member;

a gas flow device disposed, proximate said folded fin member; and a slug disposed on the first surface of said first plate and surrounded by said folded fin member, said slug in thermal communication with said folded fin member wherein said slug is disposed in a generally non-vertical position.

2. The heat sink assembly of claim 1 wherein at least one of said first plate and said second plate are adapted for mounting to said gas flow device.

3. The heat sink assembly of claim 1 wherein at least one of said first plate and said second plate are comprised of a thermally conductive material.

4. The beat sink assembly of claim 3 wherein said thermally selected material is selected from the group including aluminum, copper, brass, a zinc-aluminum die cast, and a zinc alloy material.

5. The heat sink assembly of claim 1 wherein said slug is comprised of a thermally conductive material.

6. The heat sink assembly of claim 1 further comprising a thermal interface material disposed on at least one surface of said slug.

7. The heat sink assembly of claim 6 wherein said thermoelectric material is selected from the group consisting of a thermoelectric material and a thermoionic material.

8. A heatsink assembly comprising:

a folded fin member;

a first plate having said folded fin member disposed on a first surface thereof, said first plate covering a bottom surface of said folded fin member;

a second plate disposed over and in thermal contact with said folded fin member, said second plate covering a top surface of said folded fin member; and a gas flow device disposed, proximate said folded fin member wherein said folded fin member includes a portion disposed in a generally non-vertical position.

9. The heatsink assembly of claim 8 wherein said folded fin member includes at least one section disposed at a different height than another section.

10. The heat sink assembly of claim 8 wherein said folded fin member is comprised of one or more pieces.

11. The heat sink assembly of claim 8 wherein said folded fin member is comprised of material selected from the group including aluminum, copper, brass, a zinc-aluminum die cast, and a zinc alloy material.

12. A heatsink assembly comprising:

a folded fin member having a first end adapted to be disposed proximate a heat source and a second end, said folded fin member including a thermally conductive sheet having alternating ridges and troughs defining a plurality of radially space fin having opposite end edges and wherein the fins are provided having at least one aperture in a side wall thereof wherein said folded fin member includes a portion disposed in a generally non-vertical position.

13. The heatsink assembly of claim 12 wherein said folded fin member includes at least one section disposed at a different height than another section.

14. A heatsink assembly comprising:

a folded fin member having a first end adapted to be disposed proximate a heat source and a second end, said folded fin member including a thermally conductive sheet having alternating ridges and troughs defining a plurality of radially spaced fins having opposite end edges and wherein the fin are provided having at leas one aperture in a side wall thereof; and a slug coupled to said folded fin member wherein said slug is disposed in a generally non-vertical position.

15. An apparatus for producing a folded fin heatsink member comprising:

an upper die;

a pilot pin movably disposed within said upper die;

a stripper plate disposed below said upper die, said stripper plate capable of supporting a piece of material to be formed into a folded fin heatsink member;

a die block disposed beneath said stripper plate; and a forming punch extending from said die block.

16. The apparatus of claim 15 further comprising a recess formed in said upper die.

17. The apparatus of claim 16 wherein said upper die movable between a first upper die position and a second upper die position.

18. The apparatus of claim 16 wherein said stripper plate includes an aperture disposed therethrough.

19. The apparatus of claim 15 wherein said die block is movable between a first die block position and a second die block position.

20. The apparatus of claim 18 wherein said forming punch is movable through said aperture in said stripper plate and into said recess of said upper die.

* * * * *